(12) United States Patent
Cauli et al.

(10) Patent No.: US 8,519,736 B2
(45) Date of Patent: Aug. 27, 2013

(54) DIGITAL NOISE PROTECTION CIRCUIT AND METHOD

(75) Inventors: Arber Cauli, Bassano Del Grappa (IT); Luciano Prandi, Bellinzago Novarese (IT); Carlo Caminada, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/408,956

(22) Filed: Feb. 29, 2012

(65) Prior Publication Data

US 2012/0153987 A1 Jun. 21, 2012

Related U.S. Application Data (63) Continuation of application No. 12/768,276, filed on Apr. 27, 2010, now Pat. No. 8,164,357.

(30) Foreign Application Priority Data

Apr. 28, 2009 (IT) ............... TO2009A0334

(51) Int. Cl.
*H03K 17/16* (2006.01)
*H03K 19/003* (2006.01)

(52) U.S. Cl.
USPC ............... 326/22; 326/26; 326/29; 326/31; 326/52; 327/311; 327/384

(58) Field of Classification Search
USPC ..... 326/21–24, 26–29, 31, 52; 327/310–311, 327/379, 384
See application file for complete search history.

(56) References Cited

U.S. PATENT DOCUMENTS

| | | | |
|---|---|---|---|
| 5,731,715 A * | 3/1998 | Mote, Jr. ..................... | 326/93 |
| 6,535,057 B2 * | 3/2003 | Chakravarthy ............... | 327/551 |
| 7,305,880 B2 | 12/2007 | Caminada et al. | |
| 2003/0042929 A1 * | 3/2003 | Kock et al. ...................... | 326/31 |
| 2010/0271067 A1 * | 10/2010 | Cauli et al. ..................... | 326/22 |

FOREIGN PATENT DOCUMENTS

| EP | 0632590 A1 | 1/1995 |
|---|---|---|
| EP | 1294123 A1 | 3/2003 |
| JP | 62155615 A | 7/1987 |
| JP | 5218822 A | 8/1993 |
| JP | 6209245 A | 7/1994 |
| JP | 8242153 A | 9/1996 |
| JP | 10190413 A | 7/1998 |

* cited by examiner

*Primary Examiner* — Jason M Crawford
(74) *Attorney, Agent, or Firm* — Seed IP Law Group PLLC (57) ABSTRACT

A method of protection from noise of a digital signal generated by a comparator, including the steps of generating an output signal that switches from a first logic state to a second logic state at a first switching of logic state of the digital signal; detecting a change from the first logic state to the second logic state of the output signal; and inhibiting further switchings of the output signal for a first time interval after the change from the first logic state to the second logic state.

18 Claims, 5 Drawing Sheets

DIGITAL NOISE PROTECTION CIRCUIT AND METHOD

CROSS-REFERENCE TO RELATED APPLICATION

This application is a continuation of U.S. Pat. No. 8,164,357, granted Apr. 24, 2012, patent application Ser. No. 12/768,276, filed Apr. 27, 2010, which patent is incorporated herein by reference in its entirety.

BACKGROUND

1. Technical Field

The present disclosure relates to a device and a method of protection from noise that is present in a digital signal.

2. Description of the Related Art

Figure 1:
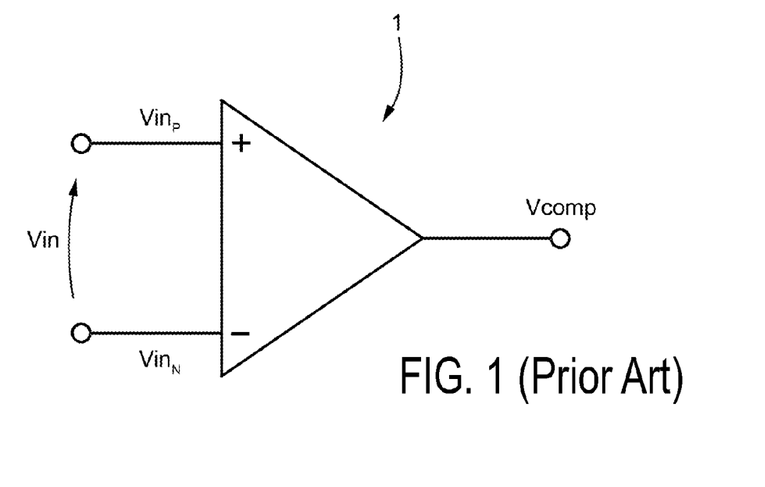
FIG. 1 shows a comparator of a known type.

FIG. 1 shows a continuous-time differential comparator 1 of a known type. The comparator 1 is configured for accepting at input an analog input signal Vin and supplying at output a comparison signal Vcomp, of a binary type, which can assume a high logic value $Vcomp_H$ (logic 1) or a low logic value $Vcomp_L$ (logic 0) on the basis of the analog input signal Vin.

In greater detail, the comparator 1 receives on an inverting input and on a non-inverting input the analog input signal Vin. In use, the comparator 1 compares the voltage signal $Vin_P$ present on the non-inverting input with the voltage signal $Vin_N$ present on the inverting input, and supplies at output the comparison signal Vcomp according to the following formula (1):

$$\begin{cases} Vcomp = Vcomp_L & \text{if } Vin_P < Vin_N \\ Vcomp = Vcomp_H & \text{if } Vin_P > Vin_N \end{cases} \quad (1)$$

It is clear that, whereas the voltage signals $Vin_P$ and $Vin_N$ are analog signals, the comparison signal Vcomp is of a binary type, since it assumes alternatively the high logic value $Vcomp_H$ and the low logic value $Vcomp_L$.

Defining the analog input signal Vin as differential signal $Vin=Vin_P-Vin_N$ the equations of formula (1) can be expressed according to the following formula (2):

$$\begin{cases} Vcomp = Vcomp_L & \text{if } Vin_P < 0 \\ Vcomp = Vcomp_H & \text{if } Vin_P > 0 \end{cases} \quad (2)$$

Figure 2A:
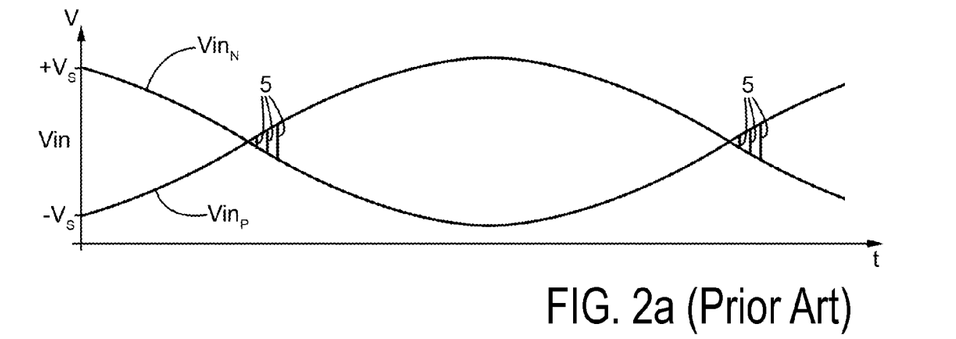
FIGS. 2a and 2b show, respectively, a differential signal at input to and at output from the comparator of FIG. 1.
Figure 2B:
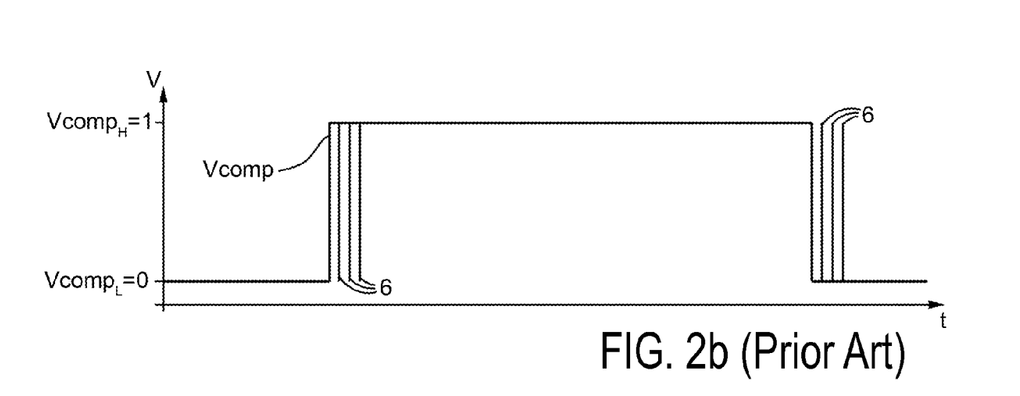

FIG. 2a shows an analog input signal Vin of a sinusoidal type, represented showing the voltage signals $Vin_P$ and $Vin_N$ at the inputs of the comparator 1, which oscillates assuming the voltage values (−Vs, . . . , +Vs), whilst FIG. 2b shows the comparison signal Vcomp, which assumes the logic value $Vcomp_H=1$ or $Vcomp_L=0$ according to the equation expressed by the formula (2).

The analog input signal Vin generally comprises a useful signal component and a noise component. The noise component may in turn be broken down into an electronic-noise component and in an impulsive-noise component. For example, noise caused by capacitive couplings, often associated with switched-capacitor circuit structures, causes brief and sudden voltage peaks (referred to as "glitches"), generally of a periodic type, when there is a switching of digital signals present in the switched-capacitor structures.

As is shown in FIGS. 2a and 2b, the presence of numerous events of impulsive noise 5 (for example, glitches) in rapid succession with respect to one another in the analog input signal Vin can cause respective noise switchings 6 of spurious and undesirable noise, which also occur in rapid succession with respect to one another, in the comparison signal Vcomp of the comparator 1.

These noise switchings 6 can cause improper operation of a system in which the comparator 1 is implemented. For instance, if the output voltage signal of the comparator 1 is used as input of a phase-locked-loop (PLL) circuit, for example of a feedback circuit that operates synchronously, the noise switchings could jeopardize proper operation of the PLL circuit and consequently of the entire system.

BRIEF SUMMARY

The present disclosure provides a device and a method of protection from noise for a digital signal that will overcome the drawbacks of known circuits.

In accordance with the present disclosure, a method of protection from noise in a digital signal generated by a comparator is provided, the method includes generating an output signal, which switches from a first logic state to a second logic state at a first switching of logic state of the digital signal; detecting a change from the first logic state to the second logic state of the output signal; and inhibiting further switchings of the output signal for a first time interval after the change from the first logic state to the second logic state.

In accordance with another aspect of the present disclosure, a circuit is provided that includes a comparator configured for generating a digital signal, and a protection circuit, the protection circuit including a signal-generating circuit configured to generate an output signal that switches from a first logic state to a second logic state upon detection of switchings of logic state of the digital signal; a state-change detection circuit, configured to detect a change from the first logic state to the second logic state of the output signal; and a switching-inhibition circuit configured to inhibit switching of the output signal for a time interval after the change from the first logic state to the second logic state.

In accordance with another aspect of the present disclosure, a resident micro-electromechanical system is provided that includes a microstructure having a mass free to oscillate; and a driving device coupled to the mass for keeping the mass in oscillation, wherein the driving device includes a reading differential amplifier; an actuation and control stage, including a PLL circuit and configured for driving the mass; and a comparator device connected between the differential read amplifier and the PLL circuit of the actuation and control stage.

In accordance with yet a further aspect of the present disclosure, a circuit is provided for masking an input signal to obtain an output signal that is protected from the noise in the input signal, the circuit including a masking circuit that receives the input signal and that controls a memory circuit to generate the output signal at a value equal to the input signal at the time the input signal is received at the masking circuit and only for a set period of time, the masking circuit further configured to repeatedly respond to changes in the logic state of the input signal after the set period of time by changing a logic state of the output signal and maintaining the logic state of the output signal for the set period of time.

In accordance with another aspect of the foregoing circuit, the memory circuit includes a flip-flop and the masking circuit includes a delay circuit having an input to receive the input signal and an output, the flip-flop having an input to receive the input signal and an output that outputs the output signal, and a control terminal coupled to the output of the delay circuit via a control gate, the delay circuit structured to operate in accordance with the set period of time.

In accordance with yet a further aspect of the present disclosure, the control gate includes an XOR gate having a first input coupled to the output of the delay circuit, a second input coupled to the output of the flip-flop, and an output coupled to the control terminal of the flip-flop.

BRIEF DESCRIPTION OF THE SEVERAL VIEWS OF THE DRAWINGS

For a better understanding of the disclosure, a preferred embodiment thereof is now described, purely by way of non-limiting example and with reference to the attached drawings, wherein.

DETAILED DESCRIPTION

Figure 3:
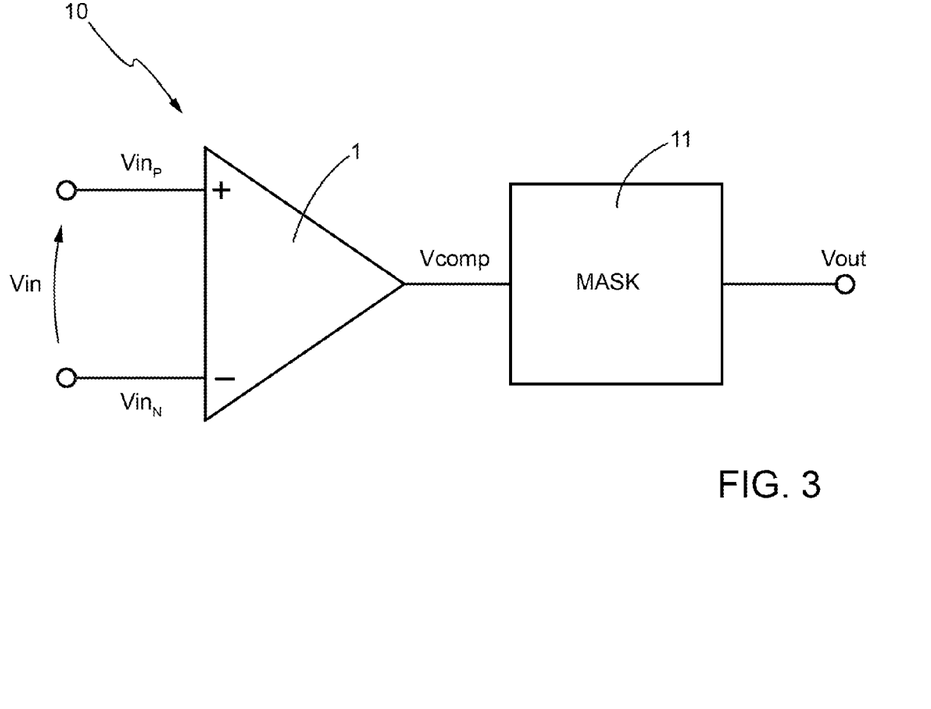
FIG. 3 shows a comparator device according to the present disclosure.

FIG. 3 shows a comparator device 10 including a comparator 1, for example, of the type described with reference to FIG. 1, and a protection circuit 11, which is configured for receiving at input a digital signal, possibly with noise signals superimposed thereon (such as, for example, the impulsive noise 5 shown in FIG. 2b) and generating a useful output signal Vout similar to the signal at input but without noise switchings 6 in rapid succession with respect to one another.

In general, the useful output signal Vout generated by the protection circuit 11 has the same period and the same duty cycle as the comparison signal Vcomp at input to the protection circuit 11. Particular cases, where the duty cycle and/or the period of the useful output signal Vout could vary with respect to the ones of the comparison signal Vcomp, will be illustrated more fully in what follows.

In greater detail, the protection circuit 11 receives at input the comparison signal Vcomp generated by the comparator 1, which, as has been described with reference to FIGS. 2a, 2b, can be subject to noise switchings 6, and generates at output a useful output signal Vout without noise switchings 6 in rapid succession with respect to one another. The protection circuit 11, in fact, operates a masking of the comparison signal Vcomp generated by the comparator 1 in order to prevent noise switchings 6 present in the comparison signal Vcomp from causing respective noise switchings in the useful output signal Vout. The masking is activated when a first switching of the comparison signal Vcomp is detected and has a masking duration Tmask.

In normal operation, i.e., in the absence of masking, the protection circuit 11 is substantially transparent and the comparison signal Vcomp is reproduced at output, creating the useful output signal Vout. A first switching edge of the comparison signal Vcomp causes a respective switching of the useful output signal Vout. Then, following upon the first switching edge, with a minimum delay, intrinsic to the electronic components used (generally of a few nanoseconds), the masking is activated. In this case, the protection circuit 11 decouples its own input from its own output, and maintains, for a set period of time equal to the masking duration Tmask, the useful output signal Vout at the last value acquired by the comparison signal Vcomp following upon detection of the switching edge, irrespective of possible further switching edges by the comparison signal Vcomp. In this way, during the entire masking duration Tmask, any possible noise switchings 6 of the comparison signal Vcomp do not generate respective switchings of the useful output signal Vout.

At the end of the masking duration Tmask, the masking step terminates, the useful output signal Vout on the output of the protection circuit 11 reproduces again the comparison signal Vcomp, and the protection circuit 11 remains in a wait state for a subsequent switching edge of the comparison signal Vcomp. The subsequent switching edge, in a way similar to what is described regarding the first switching edge, controls a respective switching of the useful output signal Vout and hence, with a delay given by the electronic components used, the masking is activated again. The protection circuit 11 decouples again its own input from its own output and maintains the useful output signal Vout at the last value acquired for the entire masking duration Tmask.

The duration of Tmask is conditioned by the duration of the period of the signal at input to the protection circuit 11 (the comparison signal Vcomp in the embodiment described). For example, it is possible to size the masking duration Tmask according to the following formula (3):

$$\text{Tmask} < T_{SEM} \quad (3)$$

where $T_{SEM}$ is the shortest semi-period of the period of the analog input signal Vin (equal, but for noise switchings 6, to the shortest semi-period of the period of the comparison signal Vcomp).

Assuming that the comparison signal Vcomp has a duty cycle of 50% (semi-periods of equal duration), by sizing the masking duration Tmask as being lower than half of the period of the analog input signal Vin, it is possible to obtain an adequate protection from possible noise, in any case guaranteeing detection of the switching edge (rising/falling edge) of the comparison signal Vcomp (assuming absence of noise in the interval comprised between the end of the masking duration Tmask and the switching edge of the comparison signal Vcomp).

In the case where the duty cycle of the comparison signal Vcomp is different from 50%, detection of the switching edge is guaranteed by sizing the masking duration Tmask in such a way that it is shorter than the semi-period of the comparison signal Vcomp having shortest duration.

Figure 4:
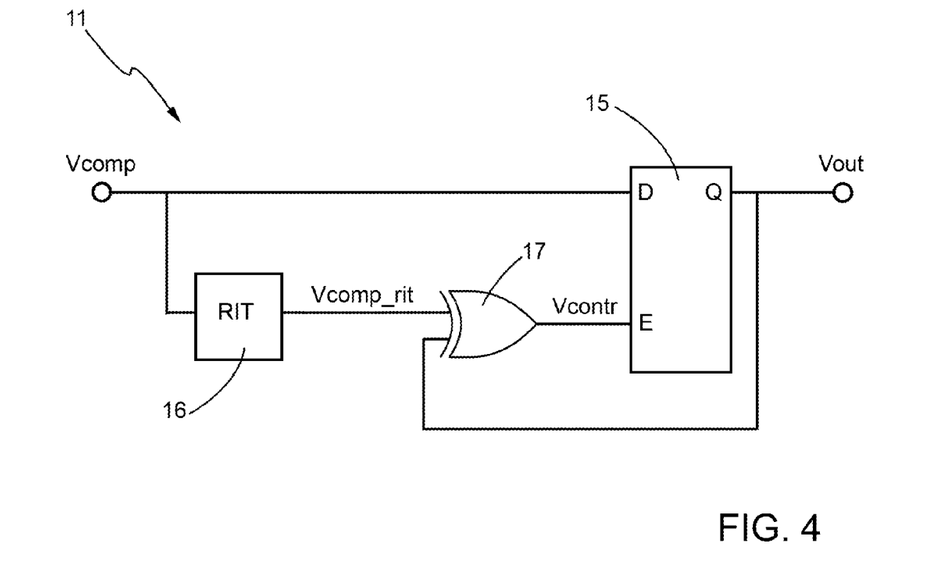
FIG. 4 shows a circuit for protection from noise signals of the comparator device of FIG. 3.

FIG. 4 shows a possible embodiment of the protection circuit 11. According to this embodiment, the protection circuit 11 comprises: a memory element, for example a flip-flop 15, configured for accepting on a data input D the comparison signal Vcomp and on an enable input E an enable signal and for generating on an output Q the useful output signal Vout; a delay element 16, configured for accepting at input the comparison signal Vcomp and for generating at output a delayed digital input signal Vcomp_rit, in particular delayed by a time equal to the desired masking duration Tmask; and a logic gate 17, more precisely an XOR gate, configured for accepting on a first input the delayed digital input signal Vcomp_rit and on a second input the useful output signal Vout generated by the flip-flop 15, and for generating at output a masking control signal Vcontr, of a digital type, supplied on the enable input E of the flip-flop 15.

In this way, the output Vcomp_rit of the delay element 16 and the output Vout of the flip-flop 15 control, through the XOR logic gate 17, operation of the flip-flop 15 itself. In fact, when the masking control signal Vcontr is low (logic 0), the useful output signal Vout corresponds to the comparison signal Vcomp, but for a delay introduced by the flip-flop 15, and hence the masking is de-activated. When the masking control signal Vcontr is high (logic 1), the masking is active and the flip-flop 15 maintains the useful output signal Vout at the value defined by the state previously acquired.

Figure 5:
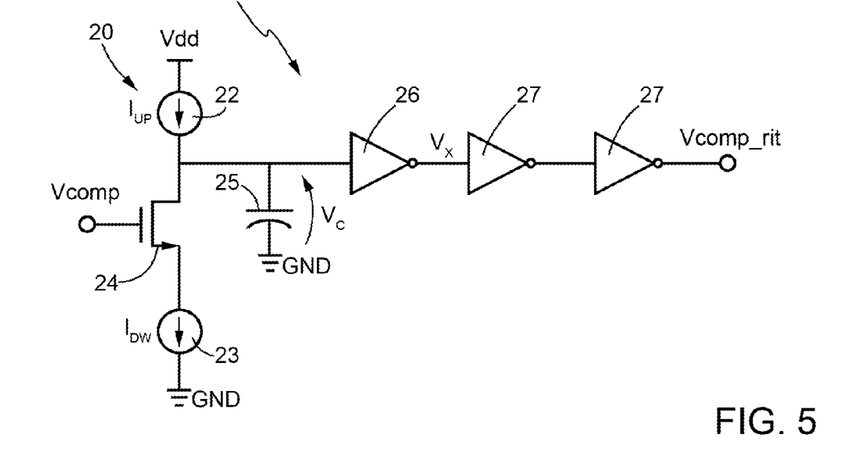
FIG. 5 shows a circuit for delay of signals within the protection circuit of FIG. 4.

FIG. 5 shows a circuit scheme of the delay element 16, according to a possible embodiment.

The delay element 16 comprises a charge pump 20, of a known type, connected to the input of the delay element and configured for being controlled by the comparison signal Vcomp.

The charge pump 20 is shown according to a schematic representation, and comprises: a first current generator 22, connected to a supply voltage Vdd (of an appropriate value, for example comprised between 2 V and 5 V) and configured for generating a current Iup; a second current generator 23, connected to a ground terminal GND (for example set at 0 V) and configured for generating a current Idw, for example equal to 2·Iup; and a switch 24, for example an N-channel MOSFET, which is sent into conduction or inhibition by means of the comparison signal Vcomp and has a first conduction terminal connected to the first current generator 22 and a second conduction terminal connected to the second current generator 23.

The first conduction terminal of the electronic switch 24 is moreover connected to a first pin of a capacitor 25, which is in turn connected via a second pin to the ground terminal GND. In addition, the first conduction terminal of the electronic switch 24 is connected to an inverter 26. Further inverters 27, for example of the same type as the inverter 26, can optionally be connected in series to the inverter 26 to obtain at output from the delay block a signal with faster rising and falling edges. The output of the series of the inverters 26 and 27 forms the delayed digital input signal Vcomp_rit.

In use, when the comparison voltage Vcomp switches to $Vcomp_L$, the electronic switch 24 is sent into inhibition, and the capacitor 25 is charged by the current Iup, until the voltage on the capacitor 25 reaches a voltage value Vc≈Vdd. Instead, when the comparison voltage Vcomp switches to $Vcomp_H$, the electronic switch 24 is sent into conduction, and the capacitor 25 discharges with a current given by Idw−Iup, until the voltage on the capacitor 25 reaches a voltage value Vc≈GND.

Masking starts when the capacitor 25 starts to charge/discharge, and lasts until the voltage Vc by increasing or decreasing crosses the inversion threshold of the inverter 26 (and of the further inverters 27, if present). Consequently, masking is activated both on the rising edge and on the falling edge of the comparison voltage Vcomp. According to the embodiment shown, the masking duration Tmask is defined by the value of capacitance C of the capacitor 25, by the current Iup, and by the value of the inversion threshold voltage Vth of the inverter 26, according to the following formula (4):

$$Tmask = \frac{C}{Iup} \cdot Vth \quad (4)$$

The masking duration Tmask is hence intrinsically defined by the charging/discharging time of the capacitor 25 upon reaching of the inversion threshold voltage Vth of the inverter 26 (and of the further inverters 27, if present).

FIGS. 6a-6f and 7a-7d show an example of variation in time of the signals involved during masking. The masking intervenes always, both in the presence of glitches or other noise and in the absence thereof.

FIGS. 6a-6f show a case in which masking intervenes in the absence of glitch and noise in general. An example of masking in the presence of glitches and noise is described with reference to FIGS. 7a-7d.

With reference to FIGS. 6a-6f and 7a-7d, the intrinsic delays of the flip-flop 15 and of the logic gate 17 are not considered for simplicity of description.

Figure 6A:
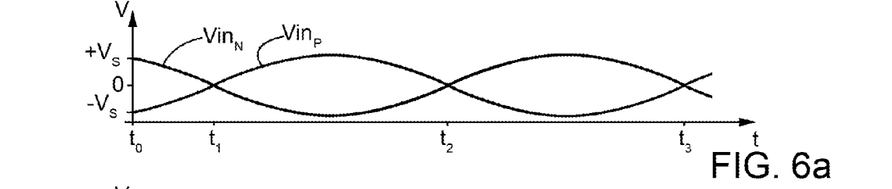
FIGS. 6a-6f show waveforms of signals at input to, present within, and generated by the comparator device of FIG. 3 in the absence of noise signals.

FIG. 6a shows the analog input signal Vin according to a differential representation, showing the voltage signals $Vin_P$ and $Vin_N$ present on respective non-inverting and inverting inputs of the comparator 1 of FIG. 3. In the example of FIG. 6a, the analog input signal Vin is of a sinusoidal type, ideally comprised in the range of voltage values (−Vs, ..., +Vs).

It is clear that the analog input signal Vin can be of a different type from the one shown and can be comprised in any range of voltage values, according to the need.

Figure 6B:
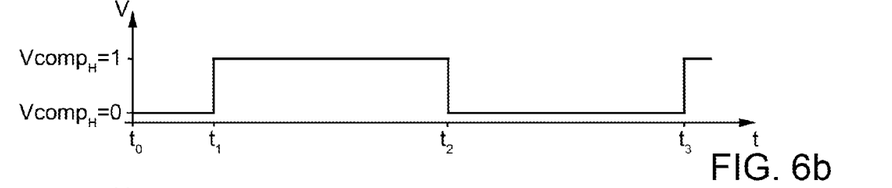

FIG. 6b shows the comparison signal Vcomp generated at output from the comparator 1 of FIG. 3. The comparison signal Vcomp is a square wave, with duty cycle of 50% and frequency equal to the frequency of the analog input signal Vin. Given that the comparison signal Vcomp is a digital signal, FIG. 6b shows an ideal representation in which the signal Vcomp takes a value of logic zero $Vcomp_L$ and a value of logic one $Vcomp_H$. It is also in this case clear that the logic zero and the logic one can be implemented by means of appropriate voltage values, according to the need.

In what follows, when not otherwise specified, the analog input signal Vin is understood as input differential signal $Vin=Vin_P-Vin_N$ at input to the comparator 1 of FIG. 3.

Figure 6C:
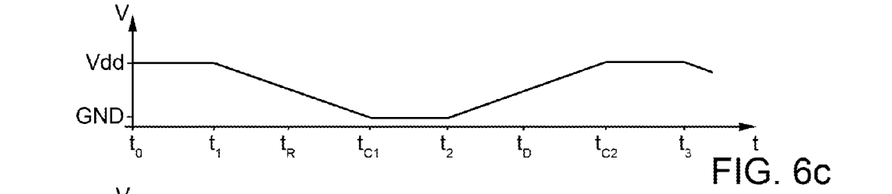

With joint reference to FIGS. 6a and 6b, in the time interval t0-t1, the analog input signal Vin is negative. Consequently, with reference to formula (2), the comparison signal Vcomp has a low logic value, equal to $Vcomp_L=0$. With reference to FIG. 5, the switch 24 is sent into inhibition, and the capacitor 25, by charging, develops a voltage across its terminals equal to Vc≈Vdd. FIG. 6c shows the evolution of the voltage Vc on the capacitor 25 (assumed, for simplicity of description, already partially charged at the instant t0).

At the temporal instant t1, the analog input signal Vin is equal to zero ($Vin_P=Vin_N$) and, at the temporal instants subsequent to t1, the analog input signal Vin assumes a positive value. The comparison signal Vcomp switches from the low logic level at the high logic level, assuming the value $Vcomp_H=1$. In particular, with joint reference to FIG. 5, the value of effective voltage of $Vcomp_H$ must be such as to send the switch 24 into conduction and enable a progressive discharging of the capacitor 25. For example, it is possible to associate to the logic one the value of 3.5 V.

As is shown in FIG. 6c, the capacitor 25 starts to discharge at the temporal instant t1 (the voltage Vc across it decreases) and is completely discharged at the temporal instant tc1.

When, at a temporal instant tR comprised between the temporal instants t1 and tc1, as the voltage Vc across the capacitor 25 discharges it reaches the inversion threshold voltage Vth of the inverter 26 (and of the inverter 27, if present), and the delay circuit 16 generates at output (FIG. 6*d*) the delayed digital input signal Vcomp_rit.

Figure 6D:
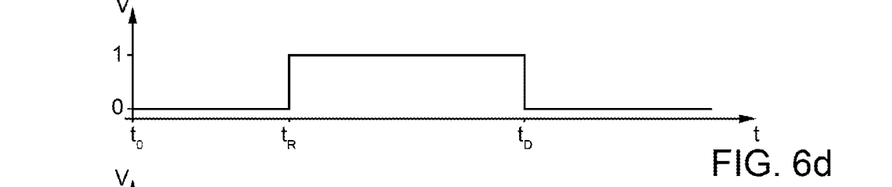
Figure 6E:
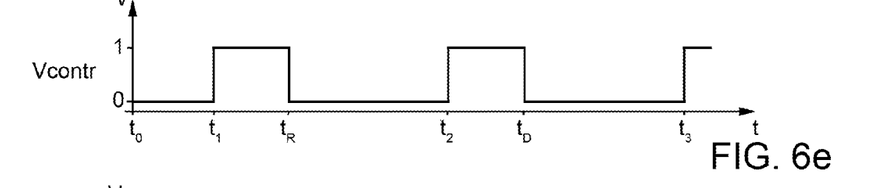
Figure 6F:
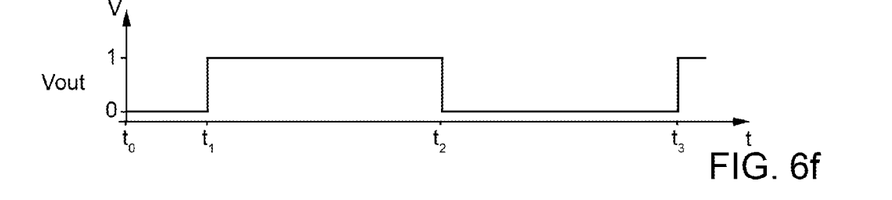

During the time interval t1-tR the signals at input to the logic gate 17 do not present the same logic value. In fact, as shown in FIGS. 6*b*, 6*d* and 6*f*, the comparison signal Vcomp with high logic value causes at the temporal instant t1 a switching to a high logic value of the useful output signal Vout, whilst the signal Vcomp_rit maintains a low logic value. The inputs of the logic gate 17, of an XOR type, consequently assume a different logic value. The masking control signal Vcontr generated by the logic gate 17 is hence a signal with high logic value.

The masking control signal Vcontr on the enable input E of the flip-flop 15 (the reversed signal is not shown in the figure), in such a way that a high masking control signal Vcontr will control the flip-flop 15 in a memory state. The useful output signal Vout on the output Q maintains the last logic value acquired irrespective of the value assumed by the comparison signal Vcomp on the data input D.

Next, when the masking control signal Vcontr present on the activation input E of the flip-flop 15 is maintained at the high logic level, the output Q of the latch preserves its own state irrespective of the value assumed by the comparison signal Vcomp on the input D. Instead, when the masking control signal Vcontr on the input E switches to the low logic level, the signal on the output Q assumes the logic value of the comparison signal Vcomp present on the input D.

During the interval t1-tR, i.e., as long as the masking control signal Vcontr is maintained at the high logic value, the flip-flop 15 generates a useful output signal Vout having a high logic value, irrespective of the variations of the comparison signal Vcomp.

When, at the temporal instant tR, the delayed digital input signal Vcomp_rit assumes a high logic value, the masking control signal Vcontr assumes a low logic value. The output of the flip-flop 15 will consequently switch at the next switching of the comparison signal Vcomp.

At the temporal instant t2, the analog input signal Vin is again equal to zero ($Vin_P=Vin_N$), whereas at the temporal instants subsequent to t2 it assumes a negative value. The comparison signal Vcomp switches at the temporal instant t2 from the high logic level to the low logic level, assuming the value $Vcomp_L$ and causing a respective switching of the useful output signal Vout.

With reference to FIG. 5, the value $Vcomp_L$ must be such as to send the switch 24 into inhibition and enable discharging of the capacitor 25 (for example, $Vcomp_L$ can be equal to 0 V). As is shown in FIG. 6*c*, the capacitor 25 starts to charge at the temporal instant t2 (the voltage Vc across it increases) and is completely charged at the temporal instant tc2.

When the voltage Vc across the capacitor 25 by charging reaches the inversion threshold voltage Vth of the inverter 26 (and of the inverters 27 if present), in a temporal instant tD comprised between the temporal instants t2 and tc2, the delayed digital input signal Vcomp_rit generated by the delay circuit 16 assumes a low logic value.

In the time interval comprised between t2 and tD the masking control signal Vcontr generated by the logic gate 17, of an XOR type, is again a signal with high logic value, in so far as, in the time interval, the useful output signal Vout has a low logic value, whilst the signal Vcomp_rit has a high logic value.

Next, during the interval t2-tD, the flip-flop 15 generates at output a low logic value, independent of the variations of the comparison signal Vcomp. The flip-flop 15 is driven into a memory state and maintains the useful output signal Vout fixed at the last logic value assumed (in this case, a low logic value).

At the temporal instant tD the voltage Vc reaches the inversion threshold voltage Vth of the inverter 26 (and of the inverters 27, if present) and the delayed digital input signal Vcomp_rit assumes a low logic value. Consequently, also the masking control signal Vcontr assumes a low logic value, terminating masking. The useful output signal Vout generated by the flip-flop 15 can consequently switch at the next switching of the comparison signal Vcomp.

The masking duration Tmask is, consequently, defined by the time of discharging and charging of the capacitor 25, i.e., by the time intervals t1-tR and t2-tD, respectively.

FIG. 6*f* shows the useful output signal Vout, generated by the flip-flop 15 according to what is described with reference to FIGS. 6*a*-6*e*. The useful output signal Vout is uncoupled from the comparison signal Vcomp during the time intervals t1-tR and t2-tD, and follows the variations of the comparison signal Vcomp outside of the time intervals.

Hence, at the temporal instant t3 the input differential signal Vin is again equal to zero, and the steps described with reference to FIGS. 6*a*-6*f* are repeated.

FIGS. 7*a*-7*d* show an example in which noise (for example, marked differential glitches) present on the input voltage signal Vin (FIG. 7*a*) cause undesirable switchings of the input digital signal (FIG. 7*b*) generated by the comparator 1 of FIG. 3.

The protection circuit 11 operates as already described with reference to FIGS. 6*a*-6*f*.

Figure 7A:
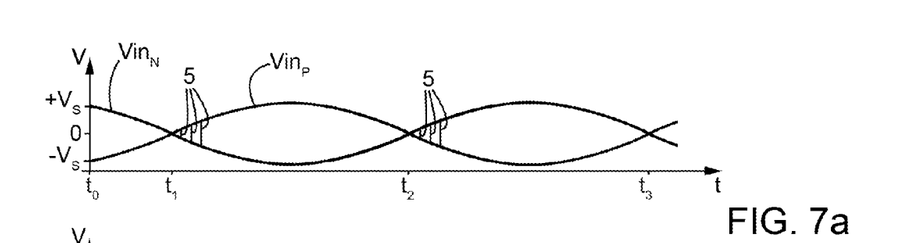
FIGS. 7a-7d show waveforms of signals at input to, present within, and generated by the comparator device of FIG. 3 in the presence of noise signals.
Figure 7B:
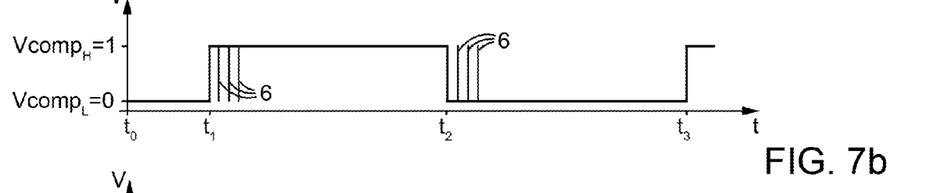
Figure 7C:
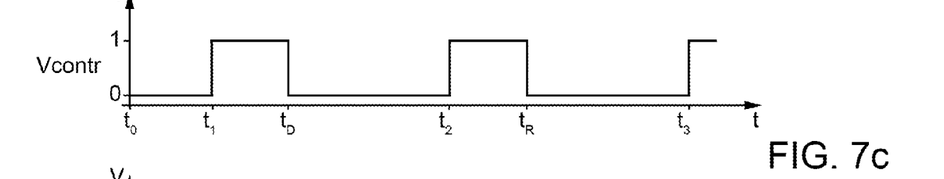
Figure 7D:
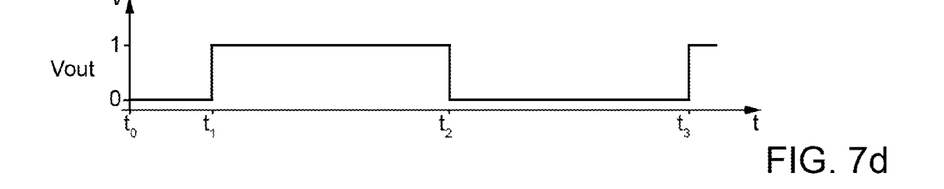

As may be noted from FIG. 7*c*, which shows the masking control signal Vcontr, the masking duration Tmask is longer than the duration of the noise disturbances that arise following upon passage through the zero of the analog input signal Vin. In this way, the useful output signal Vout is insensitive to the presence of the noise and coincides with the useful output signal Vout that would be obtained in the absence of noise on the analog input signal Vin.

As expressed by formula (4), the masking duration Tmask depends upon the current Iup, upon the value of capacitance C of the capacitor 25, and upon the inversion threshold voltage Vth. The latter, in particular, can vary as a function of the value of supply voltage Vdd (for example, in the case of an inverter of a CMOS type, the inversion threshold voltage Vth is equal to Vdd/2). To obtain a masking duration Tmask equal both to the positive switching edge of the comparison signal Vcomp and to the negative switching edge, it is preferable to guarantee that the capacitor 25 will be charged/discharged completely.

A way for sizing the various parameters that determine Tmask as a function of formulas (3) and (4) can be the following. There are considered the voltage value of the maximum threshold voltage Vth (defined in the design stage, for example, in the case of a CMOS inverter in which Vth=Vdd/2, considering the maximum value of supply voltage Vdd) and the frequency value of the maximum comparison signal Vcomp envisaged (period of the minimum comparison signal Vcomp), for which in fact the charging (and discharging) time of the capacitor 25 is longer. In addition, reasonably small nominal values of current Iup and Idw are considered, to limit consumption. Finally, on the basis of the above considerations, a nominal value of capacitance C of the capacitor 25 is defined.

The comparator device 10 can, for example, be used in circuits for driving micro-electromechanical structures, where a mobile mass must be energized and continuously kept in oscillation at a natural resonance pulsation, such as, for example, a microintegrated gyroscope. This must not, however, be considered as being in any way limiting in so far as the disclosure can be exploited in all the cases where it is advantageous to mask noise signals superimposed on a digital signal generated by a converter, by a comparator, or other device.

For example, the comparator device 10 can be used in a microintegrated gyroscope of the type described in the U.S. Pat. No. 7,305,880 and described in brief in what follows with reference to FIG. 8. Here, a microintegrated system 100, for example, a microintegrated gyroscope, comprises a microstructure 102, obtained using MEMS technology, a driving device 103, and a reading device 104, housed on a support (not shown). The microstructure 102 is provided with an actuation system 5 and an inertial sensor 6, which includes respective mobile masses. More precisely, the actuation system 5 comprises a driving mass 107, oscillating about a position of rest according to a degree of freedom of its own, whilst the inertial sensor 6 comprises a detection mass 108, mechanically connected to the driving mass 107 by means of springs (not illustrated herein) so as to be set in motion when the driving mass 107 is energized. In addition, the detection mass 108 is relatively mobile with respect to the driving mass 107 according to a further degree of freedom.

Figure 8:
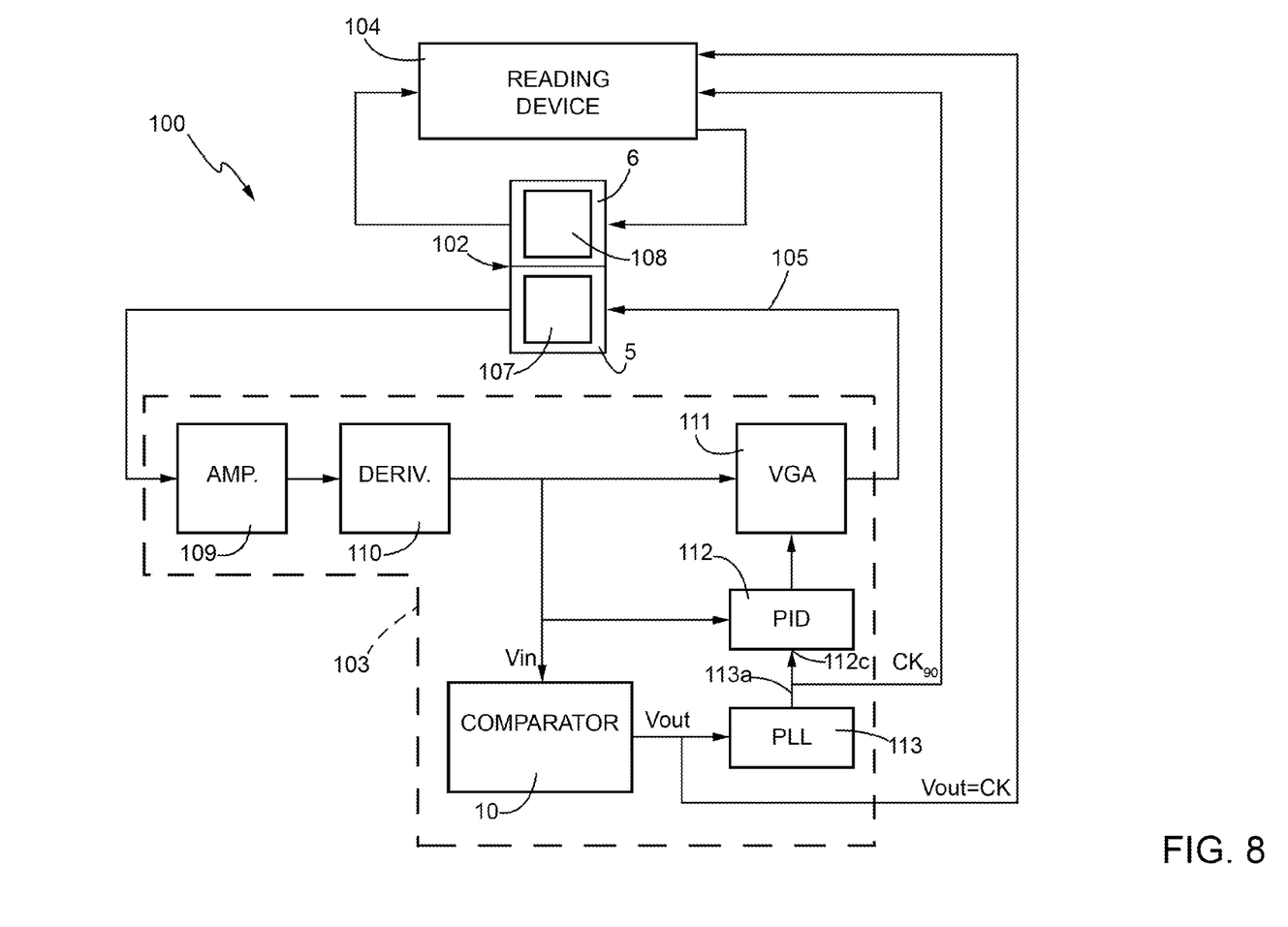
FIG. 8 shows a micro-electromechanical system in which the comparator device of FIG. 3 can be implemented.

The driving device 103 comprises, for example, an amplifier 109, a derivative stage 110, a variable-gain-amplifier (VGA) circuit 111, a controller 112, and a phase-locked-loop (PLL) circuit 113.

The PLL circuit 113 has inputs connected to the outputs of the derivative stage 110 through the comparator device 10, and an output 113a, connected to a timing input 112c of the controller 112. The comparator device 10 receives at input an analog input signal Vin at output from the derivative stage, for example, a sinusoidal signal with a frequency of 4.6 kHz, and supplies at output to the PLL circuit 113 an output signal Vout, of a binary type (in particular a square-wave signal that assumes two logic values, a high one and a low one).

The output signal Vout has here the function of first clock signal CK. The first clock signal CK, together with a second clock signal $CK_{90}$, out of phase by 90° and picked up on the output of the PLL circuit 113, is supplied to the reading device 104 in order to synchronize the operations of driving and reading of the microstructure 102.

In addition, the driving device 103 operates on the total gain and phase of the feedback-control loop 105 so as to maintain the driving mass 107 constantly in oscillation at a resonance pulsation $\omega_R$.

It is thus clear how maintaining the synchronism for the operations of driving and reading of the microstructure 102 is essential for proper operation of the microintegrated gyroscope 100. As described with reference to FIGS. 2a and 2b, noise signals could in fact generate a plurality of undesirable switchings on the first clock signal CK; in this case, the PLL circuit 113 could lose synchronism, unlocking from the frequency of oscillation of the driving mass 107, which would hence be energized at a frequency different from the resonance frequency.

It is evident from the description of the protection circuit 11 that the masking control signal Vcontr (and hence the masking of possible switchings of the comparison signal Vcomp) is activated by any change of logic state of the comparison signal Vcomp, i.e., by the passage from a low logic value to a high logic value and vice versa, irrespective of whether the change of logic state is caused by an event of noise present on the analog input signal Vin or by an effective variation of logic state.

In the presence of marked noise on the analog input signal Vin, previous to the passage through the zero of the analog input signal Vin, (for example, with reference to FIG. 7b, prior to the temporal instant t1 and/or t2 but outside the masking interval tR-t1 and/or tD-t2), it can happen that the masking will be activated by an error switching generated by a noise and not by the effective switching of the signal.

The noises are generally systematic glitches, such as to cause a temporal shift of the comparison signal Vcomp. This causes a systematic advance of the useful output signal Vout, which comes to find itself no longer in phase with the analog input signal Vin. Since the temporal shift is systematic, it can be calibrated digitally to enable the synchronism to be restored.

With particular reference to the gyroscope of FIG. 8, the useful output signal Vout is supplied at input to a PLL circuit. In this case, a possible jitter noise can be in any case compensated for by the PLL circuit itself, which, on the basis of its own specifications, is able to recover the synchronism.

Alternatively, additional compensation methods and circuits can be implemented in order to compensate for the variation of the duty cycle.

From an examination of the characteristics of the device and of the method of protection from noise of a digital signal provided according to the present disclosure the advantages that it enables emerge clearly.

For example, the present disclosure enables elimination of problems of synchronism deriving from multiple switchings in rapid succession deriving from noise signals, especially in the case of glitches that arise in switched-capacitor architectures.

In addition, the masking of the noise is carried out without the need for digital signals generated outside the comparator circuit 10 by a purposely provided digital circuit dedicated to control of the masking.

Finally, it is clear that modifications and variations may be made to the device and method of protection from noise for a digital signal described and illustrated herein, without thereby departing from the sphere of protection of the present disclosure, as defined in the annexed claims.

For example, the delay circuit 16 and the logic gate 17 can be provided in a totally digital integrated form, for example, by implementing a software comprising a counter block (not shown), configured for receiving at input the comparison signal Vcomp and supplying at output the masking control signal Vcontr, having a rising edge controlled by the rising edge of the comparison signal Vcomp and a falling edge controlled by the counter block itself.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
receiving a digital signal that switches between logic states;
generating an output signal that switches logic states in response to the switching of the logic state of the digital signal; and
inhibiting changes in the logic state of the output signal for a time interval after each change in the logic state of the digital signal, the inhibiting changes in the logic state of the output signal including:
generating a delayed digital signal from the digital signal;
generating a detection signal by comparing the delayed digital signal to the output signal; and
generating a control signal in response to the detection signal to enable a change in the logic state of the output signal after a change in the delayed digital signal is detected with respect to the output signal.

2. The method of claim 1, wherein the inhibiting changes in the logic state of the output signal includes maintaining the output signal at a current logic state during the time interval.

3. The method of claim 1, wherein generating the delayed digital signal includes:
detecting a capacitive charge; and
enabling generation of the delayed digital signal when the capacitive charge reaches a threshold value.

4. A method of protection from noise for a digital signal, comprising:
generating an output signal that switches from a first logic state to a second logic state in response to a first switching of a logic state of the digital signal;
detecting a change in the output signal from the first logic state to the second logic state;
inhibiting further switchings of the output signal for a first time interval after detecting the change in the output signal from the first logic state to the second logic state, after the first time interval:
switching the output signal from the second logic state to the first logic state upon detection of a second switching of the logic state of the digital signal;
detecting the change in the output signal from the second logic state to the first logic state;
inhibiting further switchings of the output signal for a second time interval after the change in the output signal from the second logic state to the first logic state;
wherein the detecting the change in the output signal from the first logic state to the second logic state includes:
generating a verification signal delayed with respect to the digital signal;
comparing the output signal with the verification signal; and
generating an inhibition-control signal that enables a further change of logic state of the output signal only after detection of a switching of logic state of the verification signal with respect to the output signal.

5. The method of claim 4 wherein the inhibiting further switchings includes maintaining the output signal at the second logic state during the first time interval.

6. The method of claim 4 wherein the inhibiting further switchings of the output signal for a second time interval includes maintaining the output signal at the first logic state during the second time interval.

7. The method of claim 4 in which the digital signal is a periodic signal having a semi-period and wherein the first and second time intervals each have a duration shorter than the semi-period of the digital signal.

8. The method of claim 4 wherein generating the verification signal includes:
receiving the digital signal at a control input of a switch;
respectively charging and discharging a capacitor in response to changes in the logic state of the digital signal;
detecting a value of charge of the capacitor; and
enabling generation of the verification signal upon the capacitor reaching a value of charge.

9. The method of claim 4 wherein the comparing the output signal with the verification signal includes carrying out an XOR logic operation between the output signal and the verification signal.

10. A method, comprising:
generating a comparison signal on a comparator that switches from a first logic state to a second logic state and back to the first logic state;
receiving the comparison signal at a protection circuit; and
generating an output signal from the protection circuit that is configured to switch from a first logic state to a second logic state in response to the comparison signal changing from the first logic state to the second logic state, and is configured to switch from the second logic state to the first logic state in response to the comparison signal changing from the second logic state to the first logic state; and
inhibiting switching of the output signal in the protection circuit for an interval of time after each switching of the logic state of the comparison signal;
wherein the receiving of the comparison signal includes:
receiving the comparison signal in a delay circuit and generating a delayed comparison signal; and
comparing the delayed comparison signal at a comparison circuit with the output signal and generating an enable signal to a flip-flop to enable a change in logic states of the output signal when the delayed comparison signal changes state with respect to the output signal.

11. The method of claim 10, wherein inhibiting switching includes latching the output signal in a flip-flop for the time interval.

12. The method of claim 11, wherein generating a delayed comparison signal includes:
receiving the comparison signal at a control terminal of a switch and respectively charging and discharging a capacitor with the switch in response to respective changes in the logic state of the comparison signal;
detecting a change in a value of charge of the capacitor; and
enabling generation of the delayed comparison signal through a plurality of delay stages when the charge of the capacitor reaches a threshold value.

13. A circuit, comprising:
a latch circuit including:
a flip-flop having a control node, an input node, and an output node; and
a masking circuit coupled to the latch circuit and structured to receive an input signal and to control the latch circuit to generate an output signal at a value equal to the input signal at the time the input signal is received at the masking circuit, the masking circuit further configured to change a logic state of the output signal in response to changes in a logic state of the input signal only after an interval of time following the change in the logic state of the input signal, the input node of the latch circuit configured to receive the input signal, the output node configured to output the output signal, the masking circuit including:
a delay circuit having an input node configured to receive the input signal and an output node coupled to the control node of the flip-flop, the delay circuit configured to operate in accordance with the interval of time to output a delayed input signal.

14. The circuit of claim 13 wherein the masking circuit includes a control gate coupled to the output node of the delay circuit and to the control node of the flip-flop and configured to output a control signal to the flip-flop in response to a comparison by the control gate of the logic state of the output signal and the logic state of the delayed input signal.

15. The circuit of claim 14 wherein the control gate is an XOR gate having a first input node coupled to the delay circuit, a second input node coupled to the output of the flip-flop, and an output node coupled to the control node of the flip-flop.

16. A system, comprising:
a microstructure having a mass free to oscillate; and
a driving device coupled to the mass and configured to control oscillation of the mass, the driving device including:
a reading differential amplifier;
an actuation and control stage, including a PLL circuit and configured to drive the mass; and
a comparator device coupled between the differential read amplifier and the PLL circuit of the actuation and control stage, the comparator device having a protection circuit configured to generate an output signal that switches from a first logic state to a second logic state upon detection of switchings of logic state of the digital signal, to detect a change from the first logic state to the second logic state of the output signal, and to inhibit switching of the output signal for a time interval after the input signal changes from the first logic state to the second logic state.

17. The system of claim 16, wherein the protection circuit includes:
a signal-generating circuit configured to generate the output signal that switches from the first logic state to the second logic state upon switching of the logic state of the digital signal;
a state-change detection circuit configured to detect the change of the output signal from the first logic state to the second logic state; and
a switching-inhibition circuit configured to inhibit switching of the output signal for a time interval after the change of the input signal from the first logic state to the second logic state.

18. The system of claim 17, wherein the switching inhibition circuit is configured to maintain the logic state of the output signal during the time interval.

* * * * *